United States Patent
Srinivasan et al.

(10) Patent No.: US 8,399,952 B2
(45) Date of Patent: Mar. 19, 2013

(54) INTEGRATED CIRCUIT DEVICES HAVING A STRONTIUM RUTHENIUM OXIDE INTERFACE

(75) Inventors: Bhaskar Srinivasan, Boise, ID (US); Vassil Antonov, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 13/103,162

(22) Filed: May 9, 2011

(65) Prior Publication Data

US 2011/0210423 A1    Sep. 1, 2011

Related U.S. Application Data

(62) Division of application No. 12/421,916, filed on Apr. 10, 2009, now Pat. No. 7,939,442.

(51) Int. Cl.
*H01L 21/00* (2006.01)

(52) U.S. Cl. ......... 257/468; 257/E21.269; 257/E21.275; 257/E21.625; 257/E21.679; 257/E29.255

(58) Field of Classification Search .................. 257/468, 257/565, E21.269, 274, 625, 679, 29.255
See application file for complete search history.

(56) References Cited

U.S. PATENT DOCUMENTS

| | | | |
|---|---|---|---|
| 6,335,551 B2 | 1/2002 | Takemura | |
| 6,351,006 B1 | 2/2002 | Yamakawa et al. | |
| 6,613,629 B2 | 9/2003 | Kim et al. | |
| 6,674,633 B2 | 1/2004 | Sun et al. | |
| 7,217,643 B2 | 5/2007 | Liang et al. | |
| 7,294,876 B2 | 11/2007 | Joo et al. | |
| 7,416,994 B2 | 8/2008 | Quick | |
| 7,510,931 B2 | 3/2009 | Park et al. | |
| 7,582,549 B2 | 9/2009 | Ahn et al. | |
| 7,709,399 B2 | 5/2010 | Quick | |
| 7,722,926 B2 | 5/2010 | Cho et al. | |
| 7,741,230 B2 | 6/2010 | Rachmady et al. | |
| 7,939,442 B2 * | 5/2011 | Srinivasan et al. | 438/591 |
| 2005/0151184 A1 | 7/2005 | Lee et al. | |
| 2006/0263909 A1 | 11/2006 | Choi et al. | |
| 2009/0004383 A1 | 1/2009 | Kadokura et al. | |

OTHER PUBLICATIONS

Ahn et al. "Effect of Sr-Ruthenate Seed Layer on Dielectric Properties of $SrTiO_3$ Thin Films Prepared by Plasma-Enhanced Atomic Layer Deposition", Journal of the Electrochemical Society, 155 (10), pp. G185-G188, 2008.

* cited by examiner

*Primary Examiner* — Michael Lebentritt
(74) *Attorney, Agent, or Firm* — Leffert Jay & Polglaze, P.A.

(57) ABSTRACT

Strontium ruthenium oxide provides an effective interface between a ruthenium conductor and a strontium titanium oxide dielectric. Formation of the strontium ruthenium oxide includes the use of atomic layer deposition to form strontium oxide and subsequent annealing of the strontium oxide to form the strontium ruthenium oxide. A first atomic layer deposition of strontium oxide is preformed using water as an oxygen source, followed by a subsequent atomic layer deposition of strontium oxide using ozone as an oxygen source.

20 Claims, 14 Drawing Sheets

INTEGRATED CIRCUIT DEVICES HAVING A STRONTIUM RUTHENIUM OXIDE INTERFACE

RELATED APPLICATION

This application is a Divisional of U.S. application Ser. No. 12/421,916, titled "STRONTIUM RUTHENIUM OXIDE INTERFACE," filed Apr. 10, 2009 (allowed) now U.S. Pat. No. 7,939,442, which is commonly assigned and incorporated herein by reference.

TECHNICAL FIELD

The present disclosure relates generally to integrated circuit devices, and in a particular embodiment, the present disclosure relates to methods of forming strontium ruthenium oxide interfaces using atomic layer deposition and apparatus making use of such interfaces.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

There is a general desire to reduce the sizes of the various components in integrated circuit fabrication. Reducing size is generally accompanied by a reduction in cost, as more and more devices can be fabricated on a single substrate, and a reduction in power requirements, as less power is needed to switch smaller components. However, this size reduction does not come without a cost. As integrated circuit devices become smaller and smaller, resistance and current leakage between components become increasingly problematic.

Dynamic random access memory (DRAM) is one example of an integrated circuit device. DRAM typically utilizes a memory cell having a capacitor or other charge storage device to hold a charge indicative of a data value of that memory cell. As these capacitors become smaller, their ability to hold a sufficient charge to permit sensing of the data value, and to maintain that charge for some desired period, becomes more critical.

Ruthenium (Ru) is often utilized as a bottom electrode for capacitors while strontium titanium oxide ($SrTiO_3$), sometimes referred to as strontium titanate or simply STO, is utilized for the dielectric of the capacitor. However, STO grown directly on ruthenium tends to oxidize the ruthenium to form a nonstoichiometric ruthenium oxide ($RuO_x$). This ruthenium oxide interface between the ruthenium electrode and the STO dielectric is generally undesirable. The ruthenium oxide tends to have a high surface roughness, high stress (due to lattice mismatch), and a low work function or barrier height with the STO, which are all undesirable for the desired dielectric properties of the STO.

Others have suggested the use of strontium ruthenium oxide ($SrRuO_3$), sometimes referred to as strontium ruthenate or simply SRO, as an interface between the ruthenate electrode and the STO dielectric. See, Effect of Sr-Ruthenate Seed Layer on Dielectric Properties of $SrTiO_3$ Thin Films Prepared by Plasma-Enhanced Atomic Layer Deposition, Ji-Hoon Ahn et al., *Journal of The Electrochemical Society*, 155(10) G185-G188, 2008. Such an interface between a ruthenium conductor and the STO dielectric has been shown to improve the dielectric properties of the STO dielectric. However, continuing improvements are desirable.

For the reasons stated above, and for other reasons that will become apparent to those skilled in the art upon reading and understanding the present specification, there is a need in the art for alternative structures and their processes in the formation of integrated circuit devices.

DETAILED DESCRIPTION

Figure 1A:
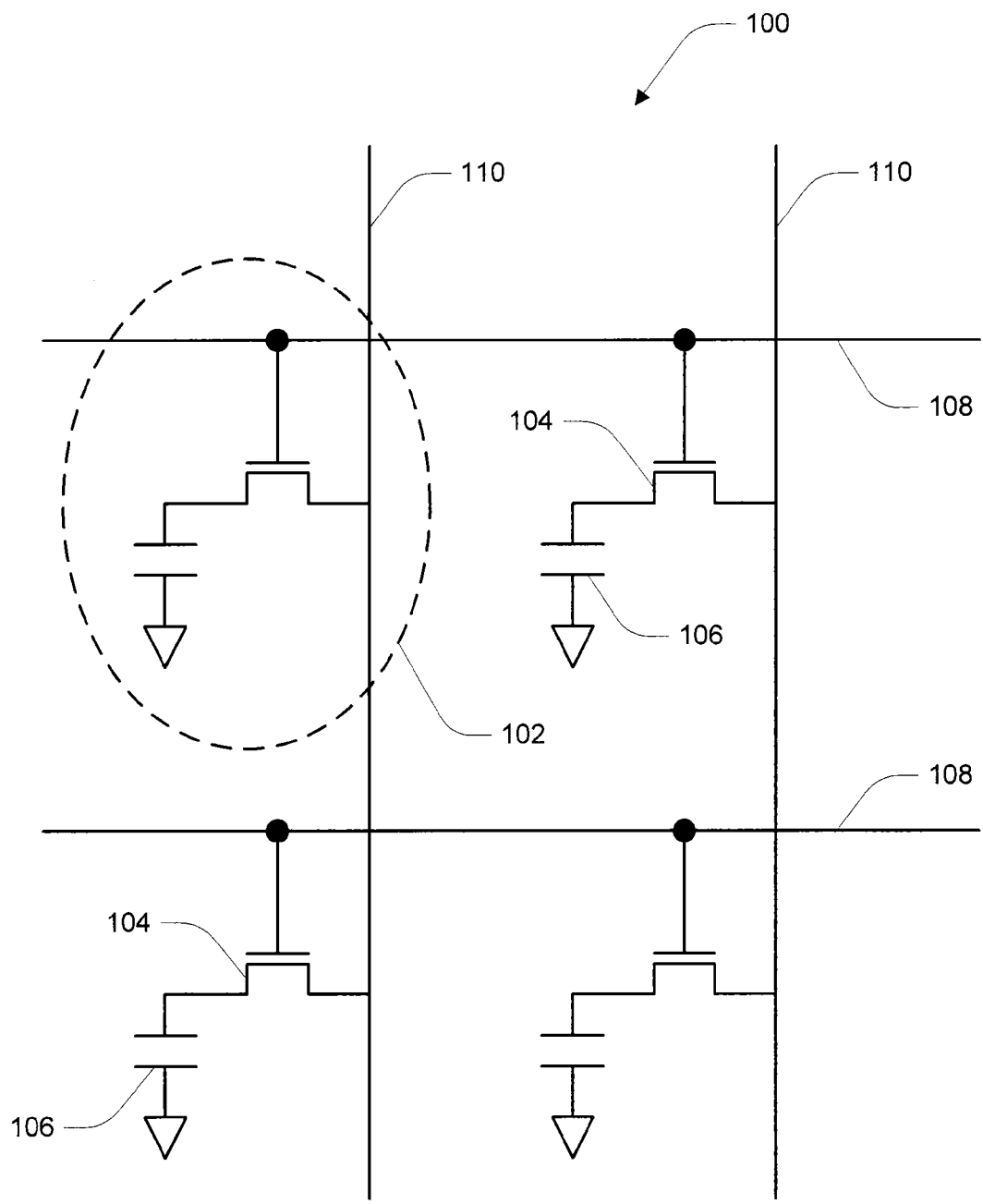
FIG. 1A is a schematic of a portion of a memory array in accordance with an embodiment of the disclosure.

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the invention, and it is to be understood that other embodiments may be utilized and that process, chemical, electrical or mechanical changes may be made without departing from the scope of the present disclosure. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. In addition, directional references, e.g., upper, lower, top, bottom and sides, are relative to one another and need not refer to an absolute direction. The following detailed description is, therefore, not to be taken in a limiting sense.

One or more embodiments include strontium ruthenium oxide (SRO) as a perovskite oxide interface between a ruthenium conductor and a strontium titanium oxide (STO) dielectric, and methods of forming such structures. Formation and use of these structures will be described in the context of their use within a memory device as one example of an integrated circuit device. However, use of these structures is not limited to their use as described with reference to memory devices. Instead, the SRO interface as formed in accordance with an embodiment of the disclosure, can be used in any integrated circuit device pairing a ruthenium conductor with an STO dielectric.

The SRO in accordance with various embodiment is formed through the use of atomic layer deposition (ALD) of strontium oxide (SrO) and subsequent annealing of the strontium oxide to form the strontium ruthenium oxide. ALD, also known as atomic layer epitaxy (ALE) is a form of chemical vapor deposition (CVD) widely used in semiconductor fabrication to form layers of material of very thin dimensions, typically on the atomic scale. The ALD process consists of an alternating series of self-limiting chemical reactions, called half-reactions, between gas-phase precursors and a substrate. The precursors are pulsed into the reactor in a sequential fashion, with purging of precursors in between. A series of these pulse/purge/pulse/purge cycles are used to form a continuous layer of material.

In the various embodiments, the strontium oxide is formed using a first ALD process using water as an oxidant followed by a second ALD process using ozone as an oxidant. The use of water as the oxidant for forming a first portion of the strontium oxide serves to inhibit adverse effects on the ruthenium conductor by passivating the underlying layer. However, the rate of formation of the strontium oxide is relatively slow using water as the oxidant. The use of ozone as the oxidant for initial monolayers of strontium oxide provides for higher rates of formation, but can tend to etch the underlying ruthenium, leading to high surface roughness. By using water as the oxidant during initial formation, and following that by using ozone for the oxidant for a remaining formation of the strontium oxide, improvements of surface roughness can be facilitated while maintaining relatively high deposition rates.

FIG. 1A is a schematic of a portion of a memory array 100 containing charge storage devices formed in accordance with an embodiment of the disclosure. The memory array 100 includes a number of memory cells 102 arranged generally in logical rows and columns. Typical memory arrays 100 contain millions of these memory cells 102. Each memory cell 102 includes an access transistor 104, with the gate of each access transistor 104 coupled to an access line 108, commonly referred to as a word line.

A first source/drain region of an access transistor 104 is coupled to a data line 110, commonly referred to as a bit line, and a second source/drain region of the access transistor 104 is coupled to a capacitor 106. The data value of the memory cell 102 is stored as a charge on the capacitor 106 and the data value is sensed by charge sharing with the associated bit line 110 and detecting the change to the potential on the associated bit line 110 as a result of the charge sharing. The capacitor 106 has a strontium ruthenium oxide interface between a ruthenium electrode and a strontium titanium oxide dielectric, and formed in accordance with an embodiment of the disclosure. A grouping of memory cells 102 coupled to the same word line 108 are typically referred to as a row of memory cells. Likewise, a grouping of memory cells 102 coupled to the same bit line 110 are typically referred to as a column of memory cells.

Figure 1B:
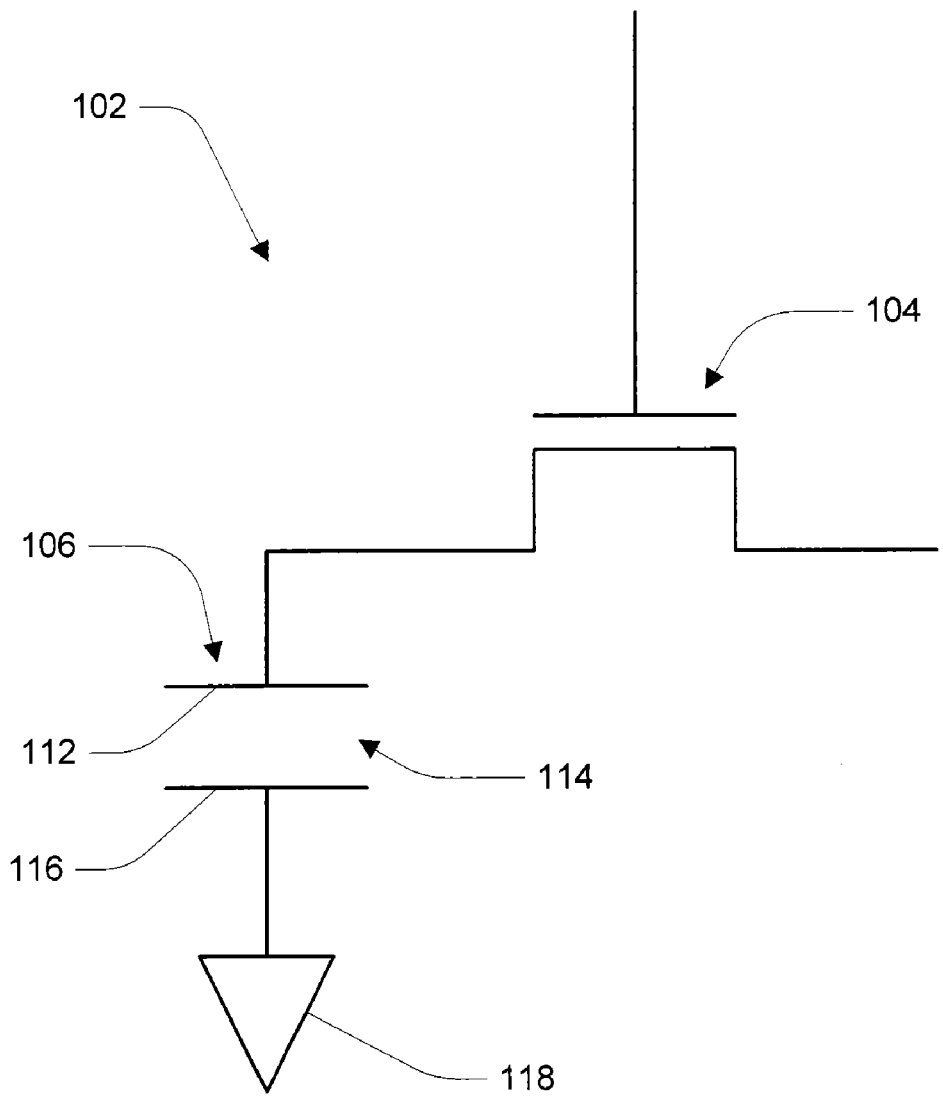
FIG. 1B is a schematic of a memory cell in accordance with an embodiment of the disclosure.

FIG. 1B is a schematic providing additional detail of a memory cell 102 in accordance with an embodiment of the disclosure. As depicted in FIG. 1B, the memory cell 102 has a source/drain region of the access transistor 104 coupled to a bottom electrode 112 of the capacitor 106. The bottom electrode 112 is a ruthenium electrode. A dielectric 114 is interposed between the bottom electrode 112 and a top electrode 116 of the capacitor 106. The dielectric 114 is a strontium titanium oxide dielectric. The top electrode 116 is typically coupled to a ground node 118. The top electrode 116 is a conductive material, e.g., polysilicon. Although represented schematically, the capacitor 106 could utilize any of a variety of capacitor geometries known in the art, such as a simple plate capacitor, or more typically some more complex three-dimensional structure such as a container capacitor, a trench capacitor or the like. Because the various embodiments apply to the methods of forming the materials, the embodiments are not limited to a specific geometry.

Figure 2:
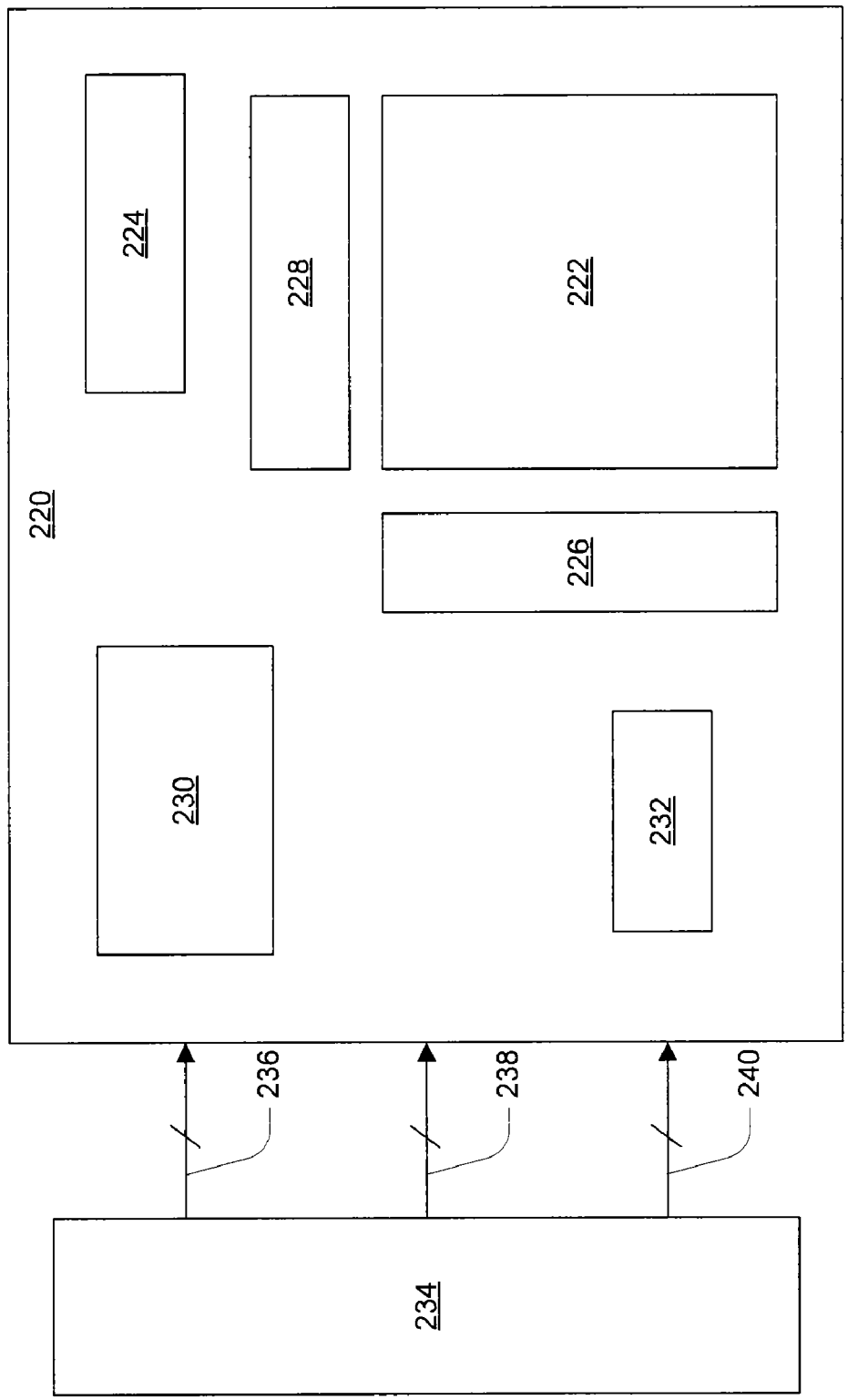
FIG. 2 is a simplified block diagram of an integrated circuit memory device in accordance with an embodiment of the disclosure.

FIG. 2 is a simplified block diagram of an integrated circuit memory 220 as a dynamic random access memory (DRAM) in accordance with an embodiment of the disclosure. The memory 220 includes an array of memory cells 222, an address decoder 224, row access circuitry 226, column access circuitry 228, control circuitry 230, and Input/Output (I/O) circuitry 232. The memory array 222 contains memory cells having an access transistor coupled between a bit line and a capacitor, such as those described with reference to FIGS. 1A-1B.

The integrated circuit memory 220 can be coupled to a processor 234 or other memory controller for accessing the memory array 222. The integrated circuit memory 220 coupled to a processor 234 forms part of an electronic system. Some examples of electronic systems include personal computers, peripheral devices, wireless electronic devices, digital cameras, personal digital assistants (PDAs), etc.

The integrated circuit memory 220 receives control signals across control lines 236 from the processor 234 to control access to the memory array 222. Access to the memory array 222 is directed to one or more target memory cells in response to address signals received across address lines 238. Once accessed in response to the control signals and the address signals, data is written to or read from the memory cells across DQ lines 240. It will be understood that the above description of a DRAM is intended to provide a general understanding of the memory and is not a complete description of all the elements and features of a DRAM. Further, the invention is equally applicable to a variety of sizes and types of integrated circuit devices known in the art and is not intended to be limited to the DRAM described above.

FIGS. 3A-3D depict conceptually an ALD process as might be used with an embodiment of the disclosure. Note that no attempt has been made to represent specific molecular structures. However, the concepts of ALD as they relate to the present disclosure will be aided by FIGS. 3A-3D.

In ALD, gaseous precursors are introduced one at a time to the substrate surface mounted within a reactor (e.g., a reaction chamber). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged, e.g., flushed with a gas, typically an inert gas, and/or evacuated. The first precursor material introduced is sometimes referred to as the precursor, and the next material introduced is sometimes referred to as the reactant, but both materials are precursors to the eventual material formed by the ALD reaction, and thus both will be referred to herein as precursors.

As an example, a first precursor is introduced into the reactor and a portion is chemisorbed at a surface of the substrate during the first pulsing phase. Typically, the first precursor is chemisorbed at an adsorption site of the surface, such as adsorbed hydroxyl sites resulting from exposure of the substrate to water vapor or ambient moisture. However, the surface treatment for creation of adsorption sites will be dependent upon the chosen precursors. The reactor is then purged, e.g., flushed with a gas, typically an inert gas, and/or evacuated, to remove excess first precursor, i.e., the first precursor that has not been chemisorbed onto the adsorption sites of the substrate, and reaction by-products. The chemisorbed first precursor results in reaction sites for the subsequent phase of the ALD process.

To continue with the example, a second precursor is introduced into the reactor and a portion reacts with the first precursor at reaction sites during the second pulsing phase. The reactor is then purged to remove excess second precursor, i.e., the second precursor that has not reacted with first precursor at the reaction sites, and reaction by-products. Following the reaction of the second precursor with the first precursor at the reaction sites, adsorption sites are formed for chemisorbing additional first precursor in a subsequent cycle of the ALD process. A number of alternating cycles can be performed to form a film of a desired thickness.

Figure 3A:
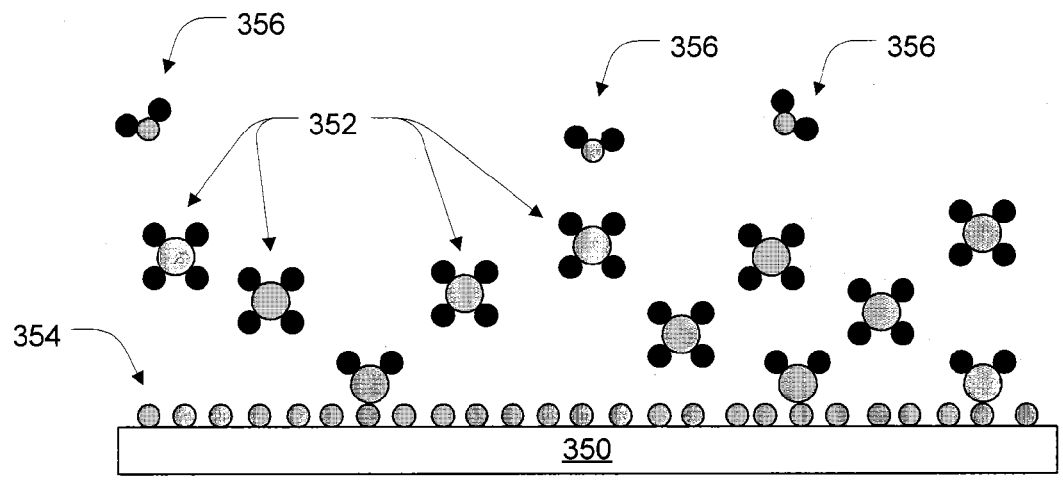
FIGS. 3A-3D depict conceptually an atomic layer deposition process in accordance with an embodiment of the disclosure.
Figure 3B:
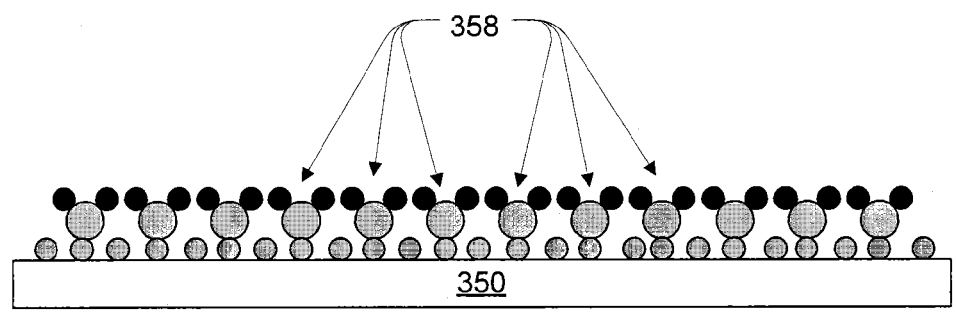
Figure 3C:
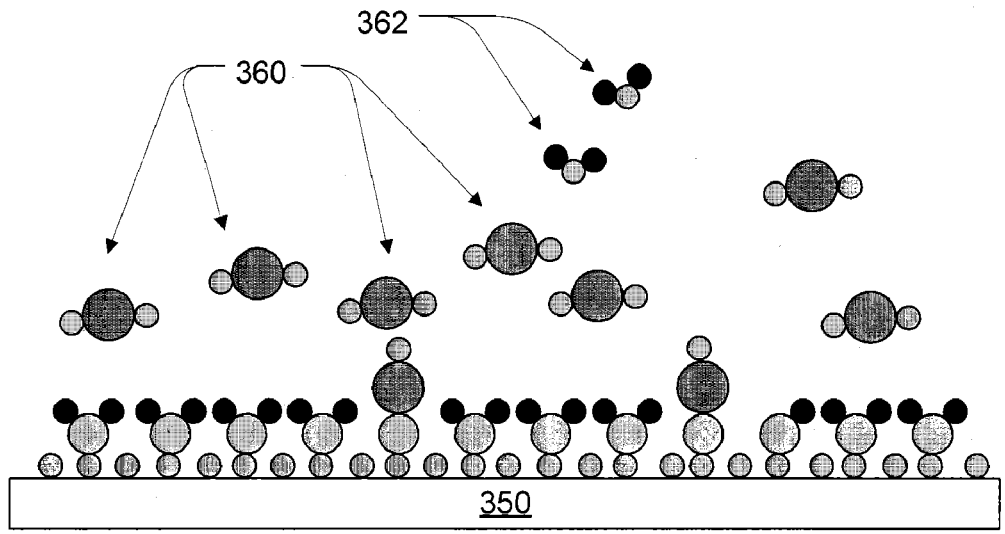
Figure 3D:
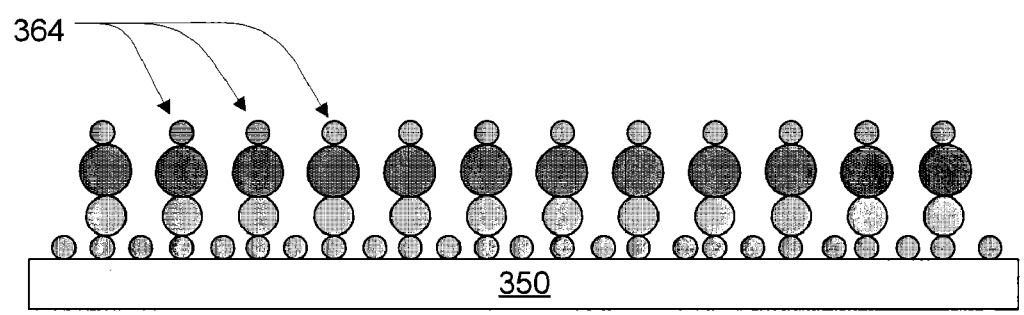

In FIG. 3A, a first precursor 352 is introduced into the reactor and a portion is chemisorbed at a surface of the substrate 350 during the first pulsing phase. Typically, the first precursor 352 is chemisorbed at an adsorption site 354 of the surface, such as adsorbed hydroxyl sites resulting from exposure of the substrate to water vapor. However, the surface treatment for creation of adsorption sites 354 will be dependent upon the chosen precursors. The reactor is then purged, e.g., flushed with a gas, typically an inert gas, and/or evacuated, to remove excess first precursor 352 in FIG. 3B, i.e., the first precursor 352 that has not been chemisorbed onto the adsorption sites 354 of the substrate 350, and reaction products 356. The chemisorbed first precursor 352 results in reaction sites 358 for the subsequent phase of the ALD process, as represented in FIG. 3B In FIG. 3C, a second precursor 360 is introduced into the reactor and a portion reacts with the first precursor 352 at reaction sites 358 during the second pulsing phase. The reactor is then purged to remove excess second precursor 360 in FIG. 3D, i.e., the second precursor 360 that has not reacted with first precursor 352 at reaction sites 358, and reaction products 362. Following the reaction of the second precursor 360 with the first precursor 352 at reaction sites 358, adsorption sites 364 are formed for chemisorbing additional first precursor 352 in a subsequent cycle of the ALD process. For one example embodiment, the first precursor 352 is a strontium source and the second precursor 360 is an oxygen source for the production of a strontium oxide material. For another example embodiment, the first precursor 352 is a titanium source and the second precursor 360 is an oxygen source for the production of a titanium oxide material. For production of a strontium titanium oxide material, alternating ALD cycles of producing strontium oxide and titanium oxide can be used.

Each cycle of the phases of FIGS. 3A-3D forms a single monolayer of material. A number of cycles of the phases of FIGS. 3A-3D can be performed in order to produce a continuous film of the desired material.

Figure 4A:
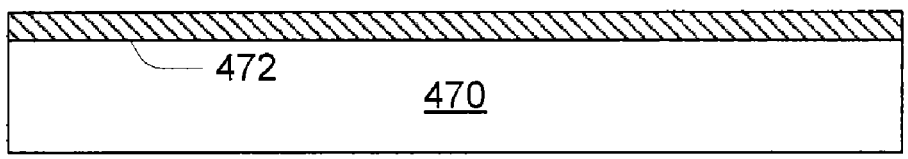
FIGS. 4A-4E are cross-sectional views of a portion of an integrated circuit device at various stages of fabrication in accordance with an embodiment of the disclosure.
Figure 4B:
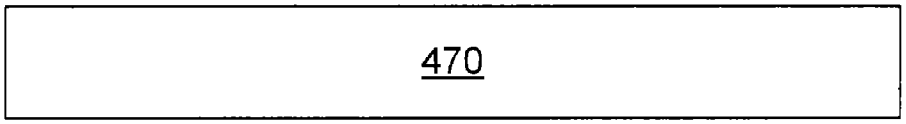

FIGS. 4A-4E are cross-sectional views of a portion of an integrated circuit device at various stages of fabrication in accordance with an embodiment of the disclosure. FIG. 4A depicts a portion of a ruthenium coated substrate. As one example, the ruthenium material 470 of the ruthenium coated substrate may represent a first, e.g., a bottom, electrode of a capacitor. In FIG. 4B, a first strontium oxide material 472 is formed overlying the ruthenium material 470. The first strontium oxide material 472 is formed using an ALD process, where the first precursor is a strontium source and the second precursor is an oxygen source consisting essentially of water. A number of ALD cycles, as described with reference to FIGS. 3A-3D, could be used to form a continuous strontium oxide material for the first strontium oxide material 472. The formation of the first strontium oxide material 472 to be continuous would serve to passivate the underlying ruthenium material 470 to protect it from subsequent processing using ozone as the second precursor. As used herein, the first strontium oxide material 472 is continuous if no portions of the underlying ruthenium material 470 are exposed through the first strontium oxide material 472 in a relevant area of interest, e.g., in an area between opposing electrodes of a future capacitor. For one embodiment, the ALD process is repeated for at least three cycles using water as the oxygen source to form the first strontium oxide material 472. For another embodiment, the ALD process is repeated using water as the oxygen source for at least a number of ALD cycles until the first strontium oxide material 472 is continuous. For a further embodiment, the ALD process is repeated until the first strontium oxide material 472 is at least approximately 20 Å, within the accuracies of industrial processing.

Figure 4C:
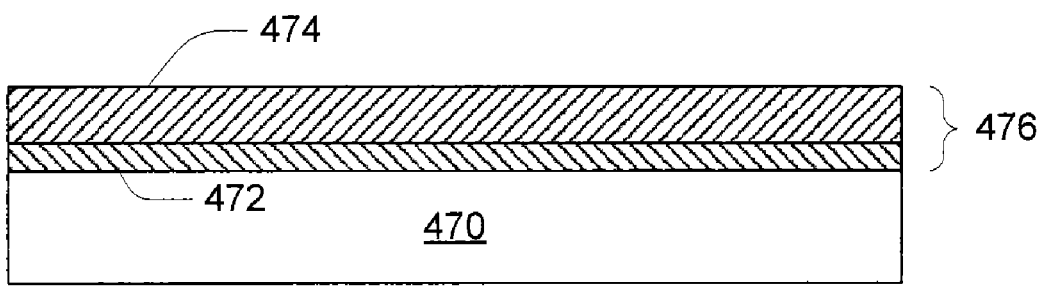

Following formation of the first strontium oxide material 472, a second strontium oxide material 474 is formed overlying the first strontium oxide material 472 in FIG. 4C. The second strontium oxide material 474 is formed using an ALD process, where the first precursor is a strontium source and the second precursor includes ozone. A number of ALD cycles, as described with reference to FIGS. 3A-3D, could be used to form a continuous strontium oxide material for the second strontium oxide material 474. The formation of the second strontium oxide material 474 to be continuous would serve to provide a smooth surface for formation of subsequent materials. As used herein, the second strontium oxide material 474 is continuous if no portions of the underlying first strontium oxide material 472 are exposed through the second strontium oxide material 474 in a relevant area of interest, e.g., in an area between opposing electrodes of a future capacitor. For one embodiment, the ALD process is repeated using ozone as an oxygen source for at least a number of ALD cycles until the second strontium oxide material 474 is continuous. For another embodiment, the ALD process is repeated until the second strontium oxide material 474 is at least approximately 20 Å, within the accuracies of industrial processing. For a further embodiment, the ALD process is repeated until the second strontium oxide material 474 is approximately 30-60 Å, within the accuracies of industrial processing.

Following formation of the second strontium oxide material 474, the structure is annealed, e.g., rapid thermal annealing for 10 minutes at 600° C. in a nitrogen ($N_2$) ambient. The annealing process serves to convert the first strontium oxide material 472 and the second strontium oxide material 474 into a strontium ruthenium oxide interface 476 having a perovskite crystalline structure. The strontium ruthenium oxide interface 476 is self-limiting in thickness, i.e., the amount of strontium ruthenium oxide material is limited by the amount of strontium oxide material available for reaction with the underlying ruthenium material 470.

Figure 4D:
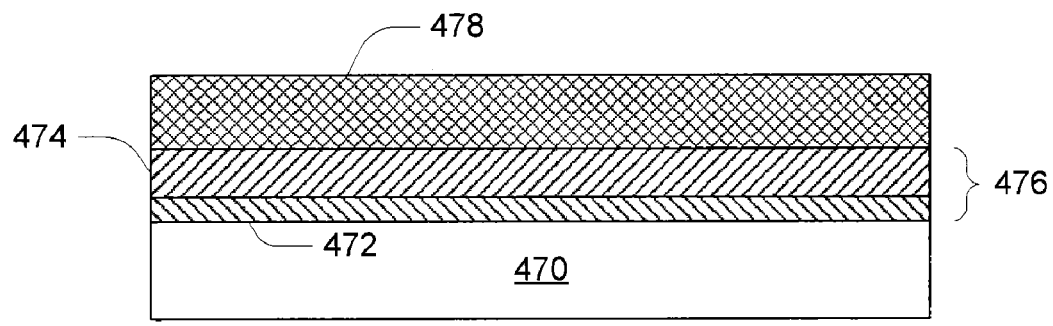
Figure 4E:
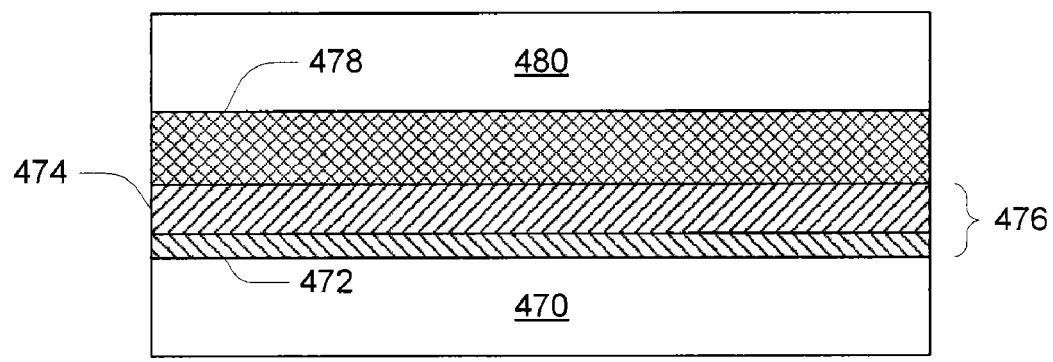

Following the anneal of the ruthenium material 470, the first strontium oxide material 472 and the second strontium oxide material 474, a strontium titanium oxide material 478 is formed overlying the second strontium ruthenium oxide interface 476 in FIG. 4D. The strontium titanium oxide material 478 may represent the dielectric of a capacitor, for example. The strontium titanium oxide material 478 may be formed using an ALD process using alternating ALD cycles for forming strontium oxide, where the first precursor is a strontium source and the second precursor is an oxygen source, and titanium oxide, where the first precursor is a titanium source and the second precursor is an oxygen source. A number of ALD cycles, as described with reference to FIGS. 3A-3D, could be used to form a continuous strontium titanium oxide material for the strontium titanium oxide material 478. As used herein, the strontium titanium oxide material 478 is continuous if no portions of the underlying strontium ruthenium oxide material 476 are exposed through the strontium titanium oxide material 478 in a relevant area of interest, e.g., in an area between opposing electrodes of a future capacitor. For one embodiment, the ALD process is repeated using alternating titanium oxide cycles and strontium oxide cycles, followed by a titanium oxide cap until the strontium titanium oxide material 478 is continuous. For another embodiment, the ALD process is repeated until the strontium titanium oxide material 478 is approximately 80-120 Å, within the accuracies of industrial processing. In FIG. 4E, if the ruthenium material 470 of the ruthenium coated substrate is meant to form a bottom electrode of a capacitor and the strontium titanium oxide material 478 is meant to form a dielectric of the capacitor, a conductive material 480 may be formed overlying the strontium titanium oxide material 478 as a second, e.g., a top, electrode of the capacitor. As one example, conductive material 480 may be conductively-doped polysilicon.

Figure 5:
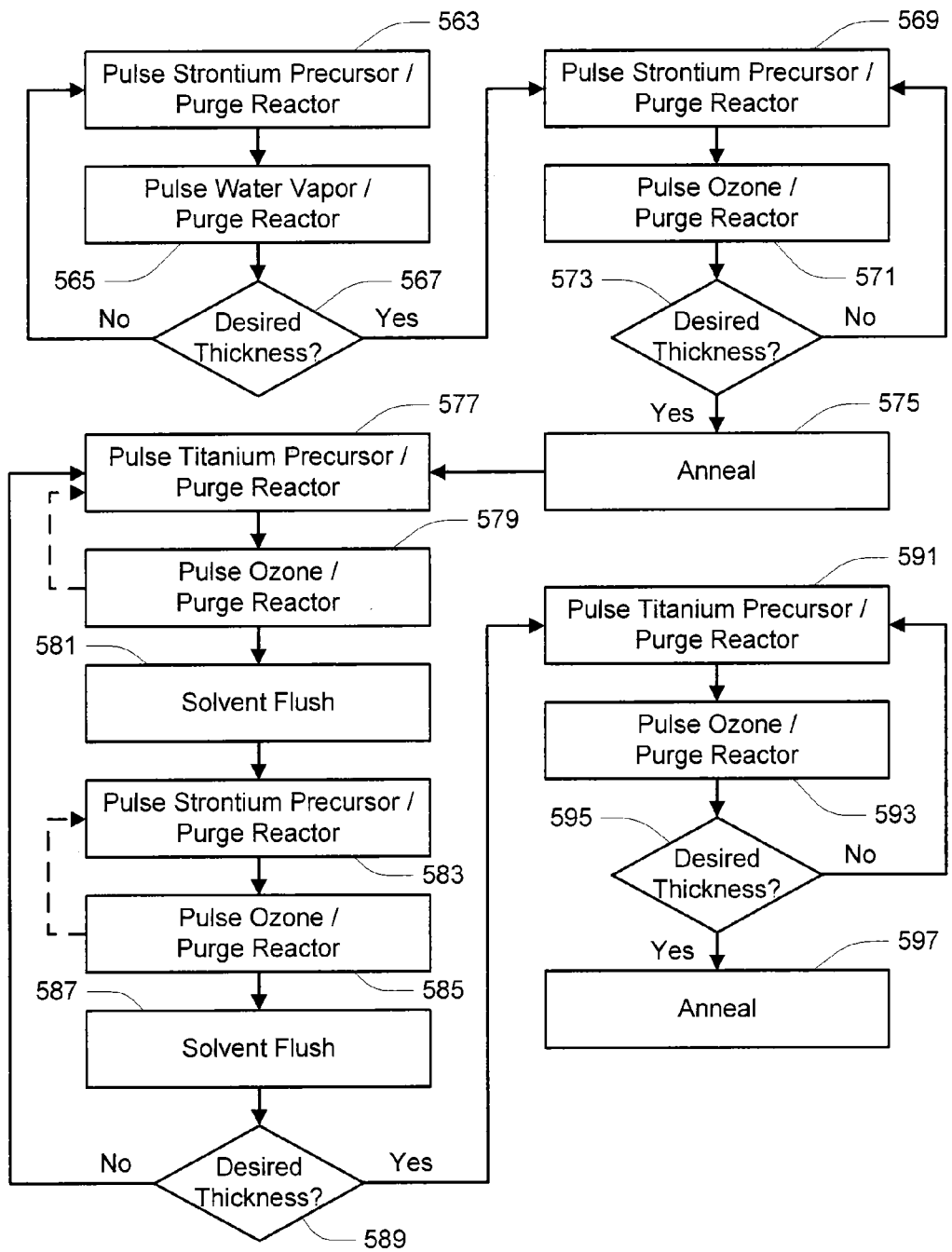
FIG. 5 is a flowchart of a method of forming a strontium ruthenium oxide interface on a ruthenium coated substrate and a strontium titanium oxide dielectric on the strontium ruthenium oxide using atomic layer deposition in accordance with one embodiment of the disclosure.

FIG. 5 is a flowchart of a method of forming a strontium ruthenium oxide interface on ruthenium and a strontium titanium oxide dielectric on the strontium ruthenium oxide using atomic layer deposition in accordance with one embodiment of the disclosure. Starting with a ruthenium coated substrate or the like, a strontium precursor is pulsed into a reactor and purged at 563. For one embodiment, the strontium precursor is $Sr(C_{11}H_{19}O_2)_2$, also known as $Sr(THD)_2$ or strontium (tetramethylheptanedionate). As an example, a flow rate of 0.4-0.8 ml/min of the strontium precursor can be fed to the reactor for 30-60 seconds at a vaporizer temperature of approximately 290° C., a substrate temperature of approximately 300-325° C. and a pressure of approximately 1-2 Torr, followed by a purge of the reactor for approximately 30 seconds. At 565, water vapor is pulsed into the reactor and purged. For one embodiment, the water vapor is fed to the reactor using a water vapor generator (WVG) system for 30-60 seconds at a substrate temperature of approximately 300-325° C. and a pressure of approximately 1-2 Torr, followed by a purge of the reactor for approximately 30 seconds.

If a thickness of the resulting strontium oxide from the ALD cycle 563/565 reaches a desired thickness at block 567, the process proceeds to block 569, otherwise the ALD cycle 563/565 is repeated. It is recognized that the thickness of the strontium oxide formed using ALD cycle 563/565 would typically not be measured after each cycle. Though in situ measurement methods are known, it would be more common to determine an expected rate of deposition for each ALD cycle 563/565, and determine an expected number of ALD cycles 563/565 needed to produce the desired thickness. For one embodiment, on the last ALD cycle 563/565 before proceeding to block 569, the reactor is flushed with solvent. For example, tetrahydrofuran (THF) can be fed to the reactor for 15-30 seconds at a flow rate of approximately 0.4-1.0 ml/min at a vaporizer temperature of approximately 290° C., a substrate temperature of approximately 300-325° C. and a pressure of approximately 1-2 Torr, and purged for approximately 30-60 seconds.

At 569, a strontium precursor is pulsed into the reactor and purged. For one embodiment, the strontium precursor is again strontium (tetramethylheptanedionate). As an example, a flow rate of 0.4-0.8 ml/min of the strontium precursor can be fed to the reactor for 30-60 seconds at a vaporizer temperature of approximately 290° C., a substrate temperature of approximately 300-325° C. and a pressure of approximately 1-2 Torr, followed by a purge of the reactor for approximately 30 seconds. At 571, ozone is pulsed into the reactor and purged. For one embodiment, the ozone is supplied to the reactor to provide an atmosphere of approximately 15% ozone by volume for 30-60 seconds at a substrate temperature of approximately 300-325° C. and a pressure of approximately 1-2 Torr, followed by a purge of the reactor for approximately 30 seconds.

If a thickness of the resulting strontium oxide from the ALD cycle 569/571 reaches a desired thickness at block 573, the process proceeds to block 575, otherwise the ALD cycle 569/571 is repeated. It is recognized that the thickness of the strontium oxide formed using ALD cycle 569/571 would typically not be measured after each cycle. Though in situ measurement methods are known, it would be more common to determine an expected rate of deposition for each ALD cycle 569/571, and determine an expected number of ALD cycles 569/571 needed to produce the desired thickness. For one embodiment, on the last ALD cycle 569/571 before proceeding to block 575, the reactor is flushed with solvent. For example, tetrahydrofuran (THF) can be fed to the reactor for 15-30 seconds at a flow rate of approximately 0.4-1.0 ml/min at a vaporizer temperature of approximately 290° C., a substrate temperature of approximately 300-325° C. and a pressure of approximately 1-2 Torr, and purged for approximately 30-60 seconds.

At 575, the structure is annealed to react the strontium oxide formed by ALD cycles 563/565 and 569/571 with the underlying ruthenium, thereby forming a strontium ruthenium oxide material having a perovskite crystalline structure. For example, the structure may be subjected to a rapid thermal anneal process for 10 minutes at 600° C. in an $N_2$ ambient.

At 577, a titanium precursor is pulsed into the reactor and purged. For one embodiment, the titanium precursor is $Ti(C_6H_{12}O_2)(C_{11}H_{19}O_2)_2$, also known as $Ti(MPD)(thd)_2$ or titanium (methylpentanedione)-(tetramethylheptanedionate). As an example, a flow rate of 0.4-0.8 ml/min of the titanium precursor can be fed to the reactor for 30-60 seconds at a vaporizer temperature of approximately 290° C., a substrate temperature of approximately 300-325° C. and a pressure of approximately 1-2 Torr, followed by a purge of the reactor for approximately 30 seconds. At 579, ozone is pulsed into the reactor and purged. For one embodiment, the ozone is supplied to the reactor to provide an atmosphere of approximately 15% ozone by volume for 30-60 seconds at a substrate temperature of approximately 300-325° C. and a pressure of approximately 1-2 Torr, followed by a purge of the reactor for approximately 30 seconds. The dashed line between blocks 579 and 577 indicates that the ALD cycle 577/579 can be performed for one or more cycles before proceeding to block

581. At 581, the reactor is flushed with solvent. For example, tetrahydrofuran (THF) can be fed to the reactor for 15-30 seconds at a flow rate of approximately 0.4-1.0 ml/min at a vaporizer temperature of approximately 290° C., a substrate temperature of approximately 300-325° C. and a pressure of approximately 1-2 Torr, and purged for approximately 30-60 seconds.

At 583, a strontium precursor is pulsed into the reactor and purged. For one embodiment, the strontium precursor is again strontium (tetramethylheptanedionate). As an example, a flow rate of 0.4-0.8 ml/min of the strontium precursor can be fed to the reactor for 30-60 seconds at a vaporizer temperature of approximately 290° C., a substrate temperature of approximately 300-325° C. and a pressure of approximately 1-2 Torr, followed by a purge of the reactor for approximately 30 seconds. At 585, ozone is pulsed into the reactor and purged. For one embodiment, the ozone is supplied to the reactor to provide an atmosphere of approximately 15% ozone by volume for 30-60 seconds at a substrate temperature of approximately 300-325° C. and a pressure of approximately 1-2 Torr, followed by a purge of the reactor for approximately 30 seconds. The dashed line between blocks 583 and 585 indicates that the ALD cycle 583/585 can be performed for one or more cycles before proceeding to block 587. At 587, the reactor is flushed with solvent. For example, tetrahydrofuran (THF) can be fed to the reactor for 15-30 seconds at a flow rate of approximately 0.4-1.0 ml/min at a vaporizer temperature of approximately 290° C., a substrate temperature of approximately 300-325° C. and a pressure of approximately 1-2 Torr, and purged for approximately 30-60 seconds.

If a thickness of the resulting strontium titanium oxide from the ALD cycles 577/579 and 583/585 reaches a desired thickness at block 589, the process proceeds to block 591, otherwise the ALD cycles 577/579 and 583/585 are repeated. It is recognized that the thickness of the strontium titanium oxide formed using ALD cycles 577/579 and 583/585 would typically not be measured after each cycle. Instead, it would be more common to determine an expected rate of deposition for each repetition of ALD cycles 577/579 and 583/585, and determine an expected number of ALD cycles 577/579 and 583/585 needed to produce the desired thickness.

At 591, a titanium precursor is pulsed into the reactor and purged. For one embodiment, the titanium precursor is again titanium (methylpentanedione)-(tetramethylheptanedionate). As an example, a flow rate of 0.4-0.8 ml/min of the titanium precursor can be fed to the reactor for 30-60 seconds at a vaporizer temperature of approximately 290° C., a substrate temperature of approximately 300-325° C. and a pressure of approximately 1-2 Torr, followed by a purge of the reactor for approximately 30 seconds. At 593, ozone is pulsed into the reactor and purged. For one embodiment, the ozone is supplied to the reactor to provide an atmosphere of approximately 15% ozone by volume for 30-60 seconds at a substrate temperature of approximately 300-325° C. and a pressure of approximately 1-2 Torr, followed by a purge of the reactor for approximately 30 seconds.

If a thickness of the resulting strontium titanium oxide from the ALD cycles 591/593 reaches a desired thickness at block 595, the process proceeds to block 597, otherwise the ALD cycle 591/593 is repeated. It is recognized that the thickness of the titanium oxide formed using ALD cycle 591/593 would typically not be measured after each cycle. Instead, it would be more common to determine an expected rate of deposition for each ALD cycle 591/593, and determine an expected number of ALD cycles 591/593 needed to produce the desired thickness.

At 597, the structure is annealed to crystallize the strontium titanium oxide formed by ALD cycles 563/565, 569/571 and 591/593. For example, the structure may be subjected to a rapid thermal anneal process for 10 minutes at 600° C. in an $N_2$ ambient. Subsequent process may then be performed, depending upon the desired integrated circuit device being fabricated. For example, if the ruthenium is an electrode of a capacitor, and the strontium titanium oxide is a dielectric of the capacitor, subsequent processing may include the formation of an opposing electrode to complete the capacitor.

Figure 6A:
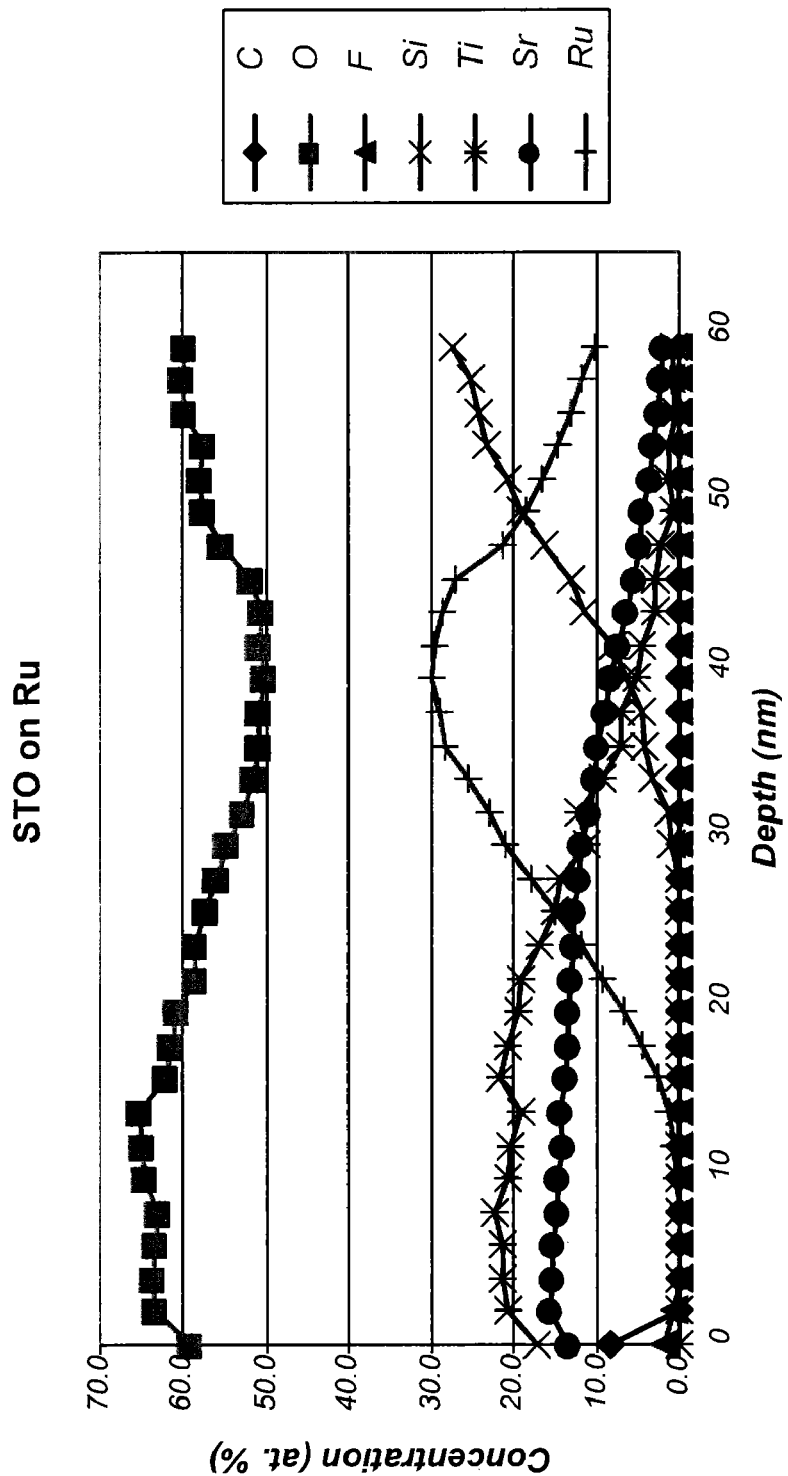
FIG. 6A is a graph of the concentration gradient across a sample of strontium titanium oxide grown on ruthenium over a silicon dioxide support.
Figure 6B:
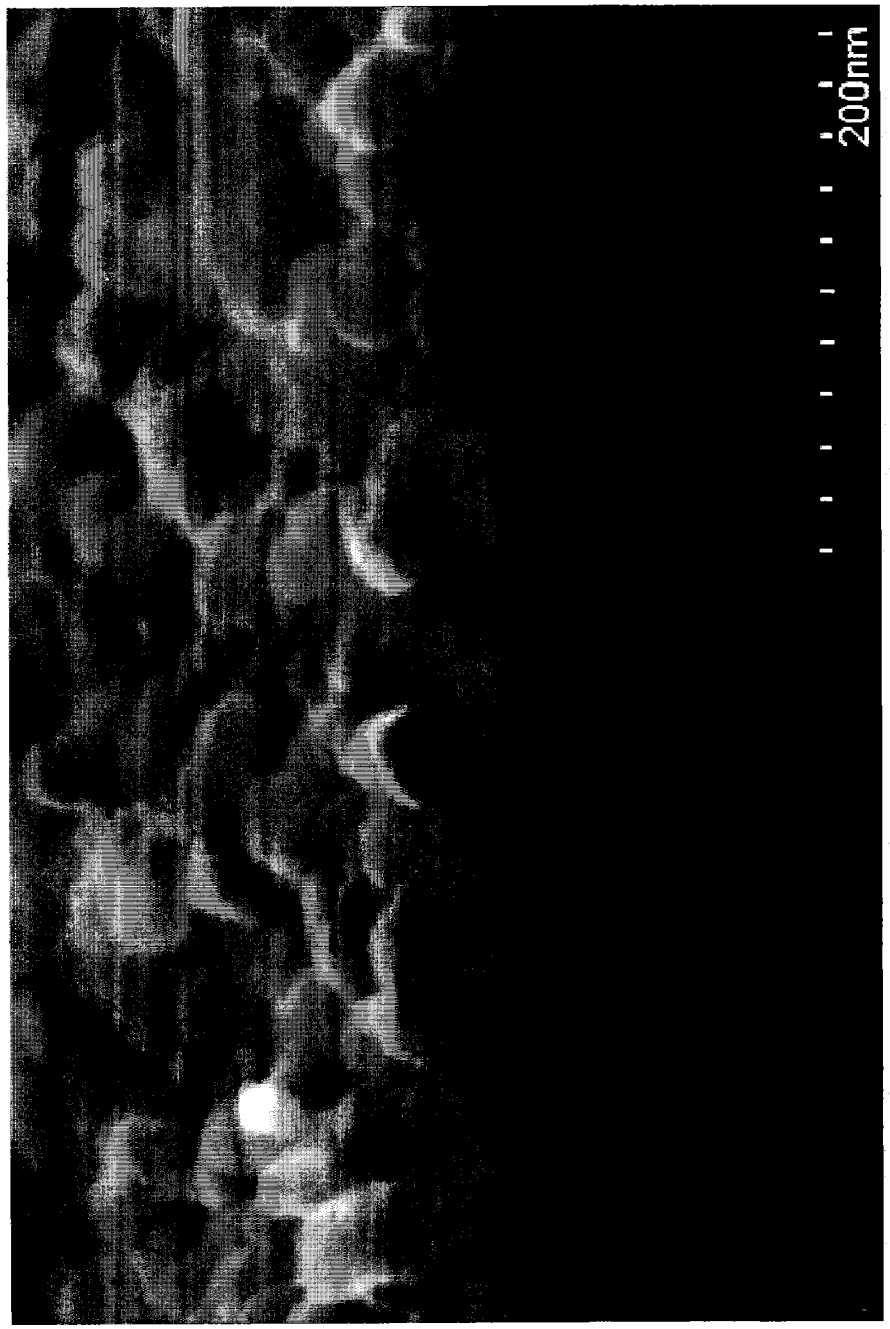
FIG. 6B is a scanning electron micrograph showing the interface reaction of strontium titanium oxide with the ruthenium.
Figure 7A:
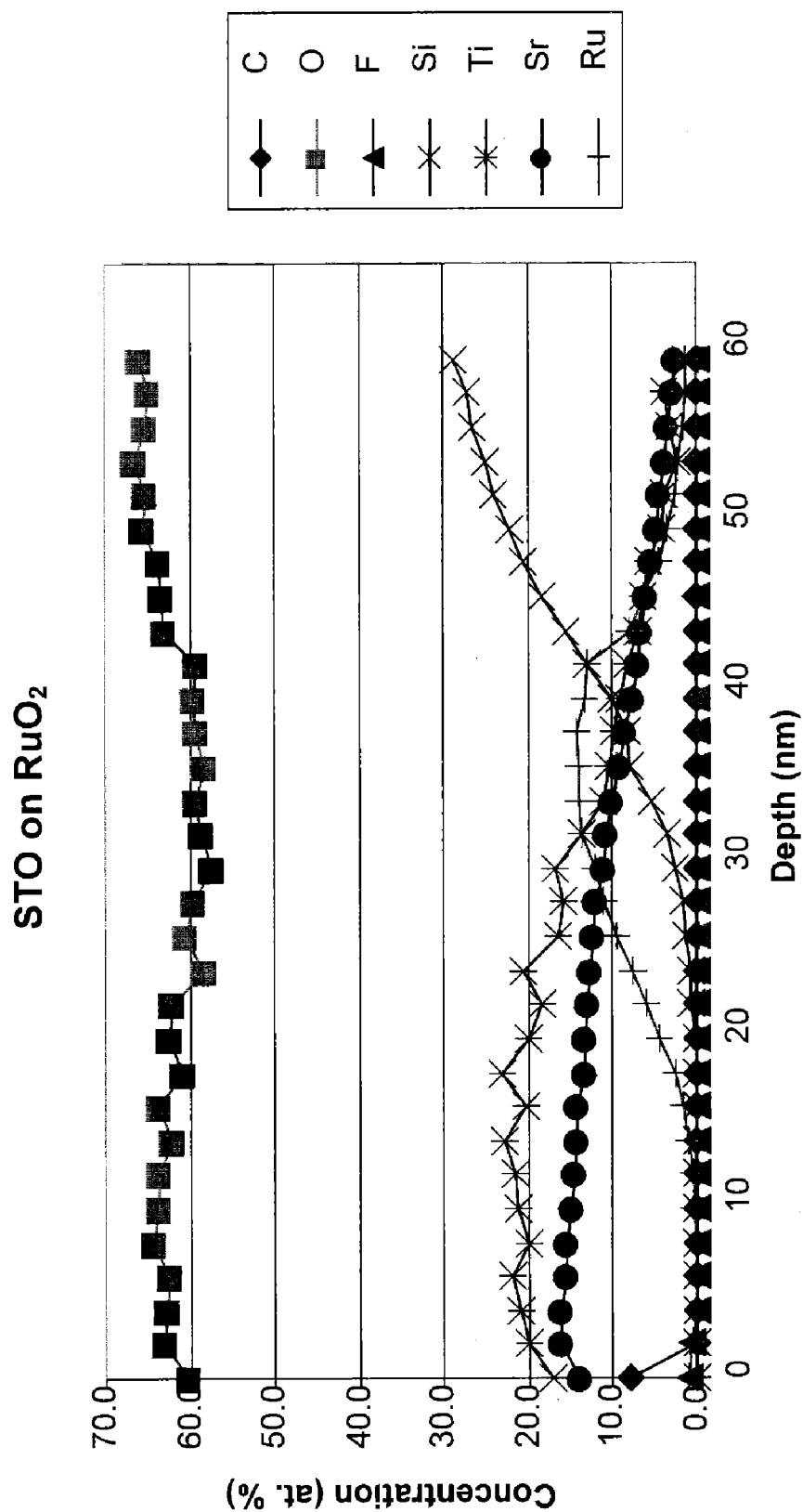
FIG. 7A is a graph of the concentration gradient across a sample of strontium titanium oxide grown on ruthenium oxide over a silicon dioxide support.
Figure 7B:
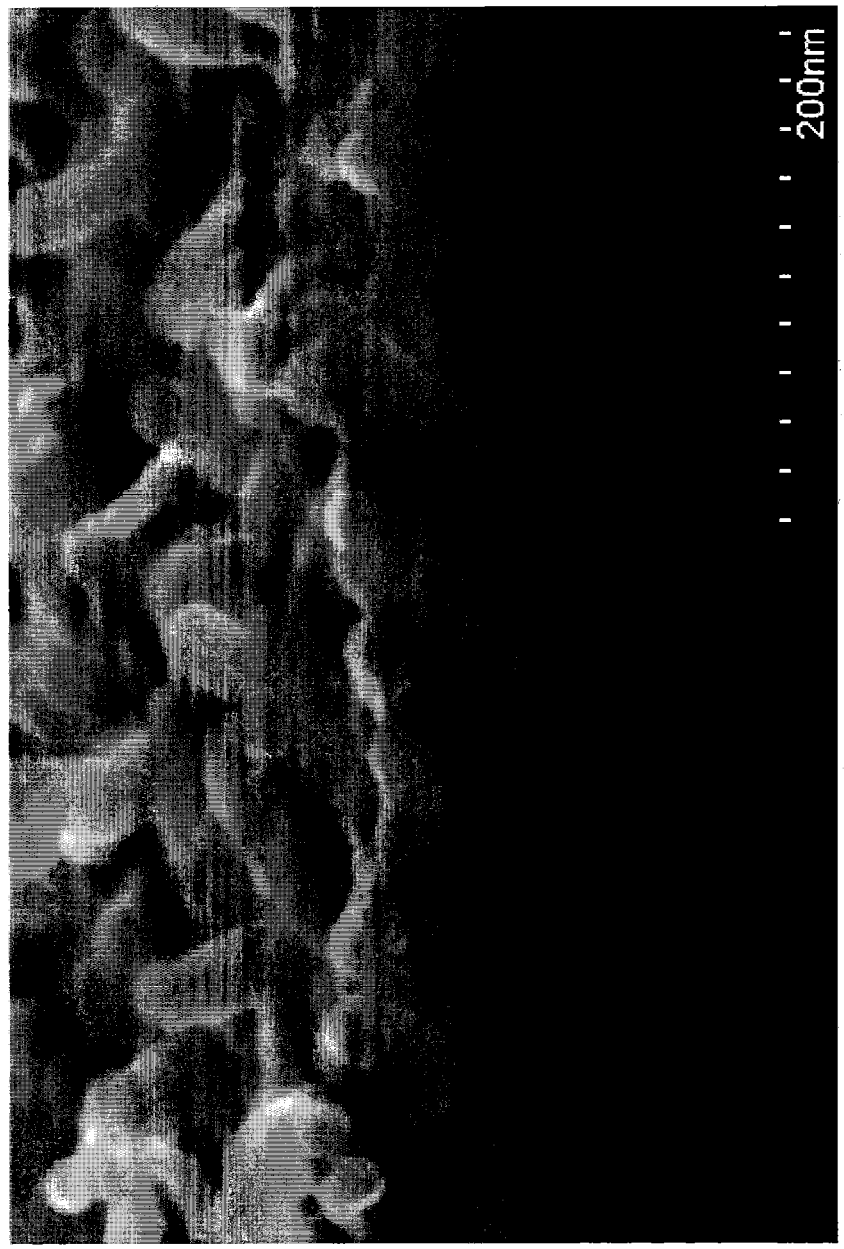
FIG. 7B is a scanning electron micrograph showing the interface reaction of strontium titanium oxide with the ruthenium oxide.
Figure 8A:
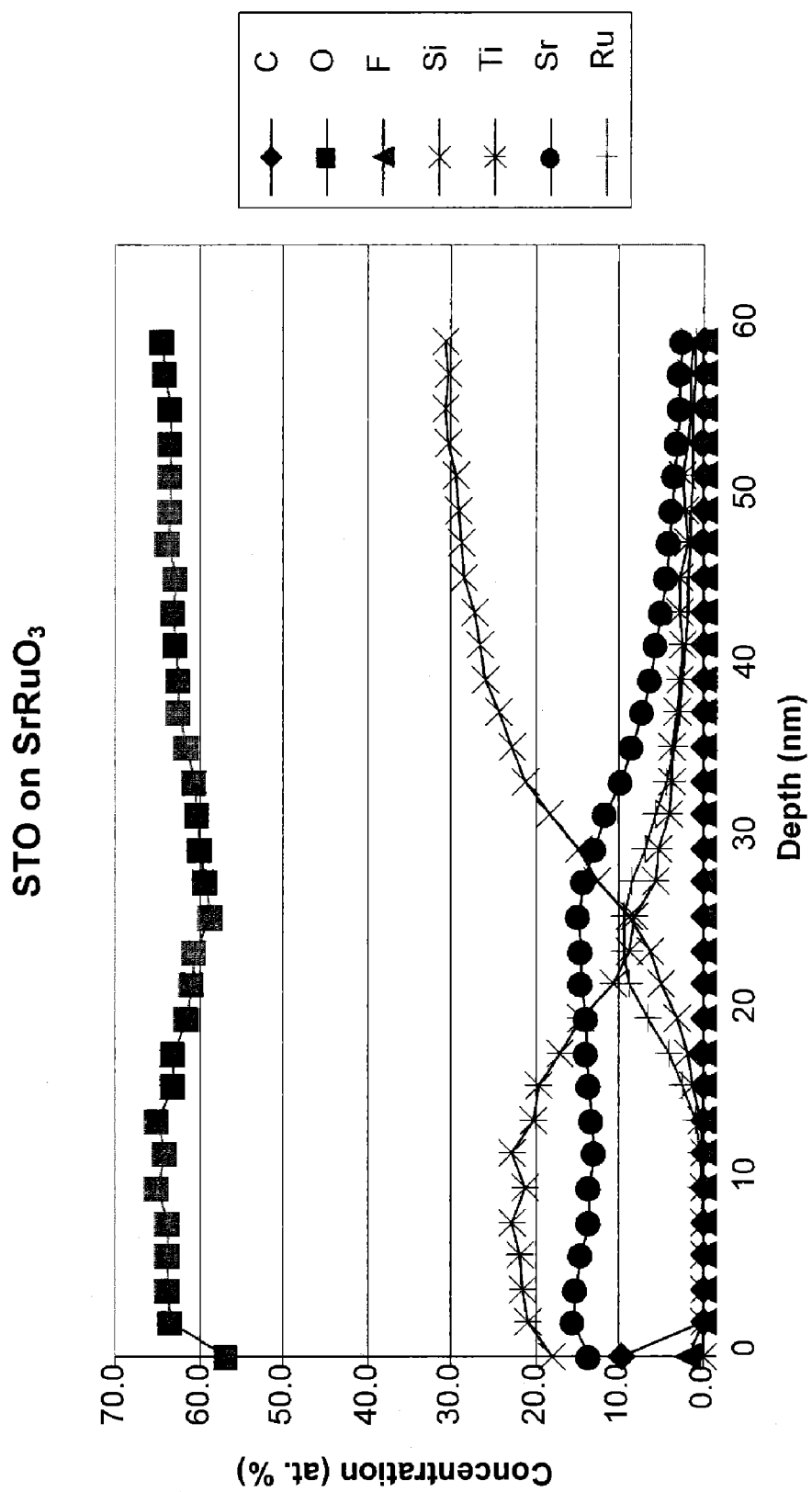
FIG. 8A is a graph of the concentration gradient across a sample of strontium titanium oxide grown on strontium ruthenium oxide over a silicon dioxide support.
Figure 8B:
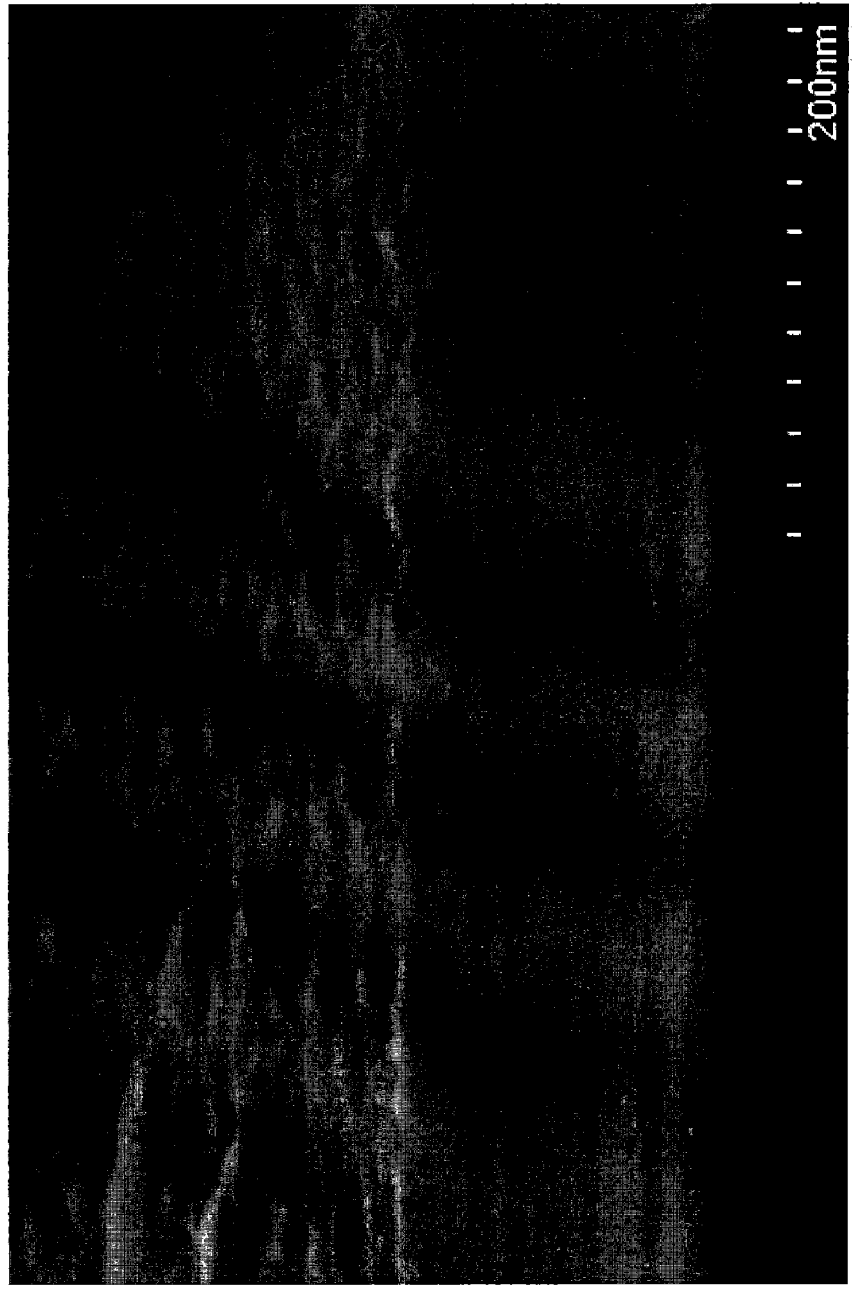
FIG. 8B is a scanning electron micrograph showing the interface reaction of strontium titanium oxide with the strontium ruthenium oxide.

By incorporating a strontium ruthenium oxide interface between a ruthenium conductor and a strontium titanium oxide dielectric formed using atomic layer deposition using water as an oxidant during a first portion and ozone as an oxidant during a second portion, strontium titanium oxide dielectrics having smooth surface characteristics have been demonstrated. FIG. 6A is a graph of the concentration gradient across a sample of strontium titanium oxide grown on ruthenium over a silicon dioxide support. FIG. 6B is a scanning electron micrograph showing the interface reaction of strontium titanium oxide with the ruthenium. FIGS. 6A-6B show significant interface reaction of the strontium titanium oxide with the ruthenium, and interdiffusion of strontium and titanium elements. FIG. 7A is a graph of the concentration gradient across a sample of strontium titanium oxide grown on ruthenium oxide over a silicon dioxide support. FIG. 7B is a scanning electron micrograph showing the interface reaction of strontium titanium oxide with the ruthenium oxide. FIGS. 7A-7B show the interface reaction of the strontium titanium oxide with the ruthenium oxide. FIG. 8A is a graph of the concentration gradient across a sample of strontium titanium oxide grown on strontium ruthenium oxide over a silicon dioxide support. FIG. 8B is a scanning electron micrograph showing the interface reaction of strontium titanium oxide with the strontium ruthenium oxide. FIGS. 8A-8B show relatively smooth strontium titanium oxide and relatively minor interdiffusion of strontium and titanium elements across the strontium ruthenium oxide. Preparing a strontium ruthenium interface on a ruthenium conductor as described herein facilitates passivation of the ruthenium conductor with little or no detrimental impact in the surface roughness. For example, in one sample, 20 Å of strontium oxide was formed on 80 Å of ruthenium using water as an oxidant, followed by 30 Å of strontium oxide formed using ozone as an oxidant. The sheet resistance (Rs) of the ruthenium had a mean of 350 and a range of 97 before formation of the strontium oxide, and the structure had a mean of 321 and a range of 101 after formation of the strontium oxide. In another sample, 20 Å of strontium oxide was formed on 100 Å of ruthenium using water as an oxidant, followed by 60 Å of strontium oxide formed using ozone as an oxidant. The sheet resistance (Rs) of the ruthenium had a mean of 217 and a range of 56 before formation of the strontium oxide, and the structure had a mean of 179 and a range of 48 after formation of the strontium oxide.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. An integrated circuit device, comprising:
   ruthenium;
   a strontium titanium oxide dielectric overlying the ruthenium; and
   a strontium ruthenium oxide interface interposed between the ruthenium and the strontium titanium oxide dielectric;
   wherein the strontium ruthenium oxide interface is formed using a method comprising:
      performing an atomic layer deposition process using a strontium precursor as a first precursor and water vapor as a second precursor to form a first strontium oxide material on the ruthenium;
      performing an atomic layer deposition process using a strontium precursor as a first precursor and ozone as a second precursor to form a second strontium oxide material on the first strontium oxide material; and
      annealing the ruthenium, the first strontium oxide material and the second strontium oxide material to form the strontium ruthenium oxide interface.

2. The integrated circuit device of claim 1, wherein the ruthenium is a first electrode of a capacitor and the strontium titanium oxide dielectric is a dielectric of the capacitor.

3. The integrated circuit device of claim 2, further comprising polysilicon overlying the strontium titanium oxide dielectric as a second electrode of the capacitor.

4. The integrated circuit device of claim 1, wherein, in the method, performing an atomic layer deposition process using a strontium precursor as a first precursor and water vapor as a second precursor to form a first strontium oxide material on the ruthenium comprises performing the atomic layer deposition process using the strontium precursor as a first precursor and the water vapor as a second precursor at least until the first strontium oxide material is continuous.

5. The integrated circuit device of claim 1, wherein, in the method, performing an atomic layer deposition process using a strontium precursor as a first precursor and water vapor as a second precursor to form a first strontium oxide material on the ruthenium comprises performing the atomic layer deposition process using the strontium precursor as a first precursor and the water vapor as a second precursor until the first strontium oxide material has a thickness of at least approximately 20 Å.

6. The integrated circuit device of claim 1, wherein, in the method, performing an atomic layer deposition process using a strontium precursor as a first precursor and water vapor as a second precursor to form a first strontium oxide material on the ruthenium comprises performing at least three cycles of chemisorbing the first precursor and reacting the second precursor with the chemisorbed first precursor.

7. The integrated circuit device of claim 1, wherein, in the method, performing an atomic layer deposition process using a strontium precursor as a first precursor and ozone as a second precursor to form a second strontium oxide material on the first strontium oxide material comprises performing the atomic layer deposition process using the strontium precursor as a first precursor and the ozone as a second precursor at least until the second strontium oxide material is continuous.

8. The integrated circuit device of claim 1, wherein, in the method, performing an atomic layer deposition process using a strontium precursor as a first precursor and ozone as a second precursor to form a second strontium oxide material on the first strontium oxide material comprises performing the atomic layer deposition process using the strontium precursor as a first precursor and the ozone as a second precursor until the second strontium oxide material has a thickness of at least approximately 20 Å.

9. The integrated circuit device of claim 1, wherein, in the method, performing an atomic layer deposition process using a strontium precursor as a first precursor and ozone as a second precursor to form a second strontium oxide material on the first strontium oxide material comprises performing the atomic layer deposition process using the strontium precursor as a first precursor and the ozone as a second precursor until the second strontium oxide material has a thickness of approximately 30-60 Å.

10. The integrated circuit device of claim 1, wherein, in the method, annealing the ruthenium, the first strontium oxide material and the second strontium oxide material to form the strontium ruthenium oxide interface comprises performing a rapid thermal anneal in a nitrogen ambient.

11. The integrated circuit device of claim 1, wherein, in the method, the first precursor to form the first strontium oxide material and the first precursor to form the second strontium oxide material are the same precursor.

12. The integrated circuit device of claim 1, wherein, in the method, at least one of the first precursor to form the first strontium oxide material and the first precursor to form the second strontium oxide material comprises strontium (tetramethylheptanedionate).

13. A capacitor, comprising:
    a ruthenium electrode;
    a second electrode;
    a strontium titanium oxide dielectric interposed between the ruthenium electrode and the second electrode; and
    a strontium ruthenium oxide interface interposed between the ruthenium electrode and the strontium titanium oxide dielectric;
    wherein the strontium ruthenium oxide interface is formed using a method comprising:
       performing an atomic layer deposition process using a strontium precursor as a first precursor and water vapor as a second precursor to form a first strontium oxide material on the ruthenium electrode;
       performing an atomic layer deposition process using a strontium precursor as a first precursor and ozone as a second precursor to form a second strontium oxide material on the first strontium oxide material; and
       annealing the ruthenium electrode, the first strontium oxide material and the second strontium oxide material to form the strontium ruthenium oxide interface.

14. The capacitor of claim 13, wherein the second electrode comprises a polysilicon electrode.

15. A memory device, comprising:
    an array of memory cells, the memory cells comprising an access transistor and a capacitor, wherein at least one of the capacitors comprises:
       a ruthenium electrode;
       a second electrode;
       a strontium titanium oxide dielectric interposed between the ruthenium electrode and the second electrode; and
       a strontium ruthenium oxide interface interposed between the ruthenium electrode and the strontium titanium oxide dielectric;
       wherein the strontium ruthenium oxide interface is formed using a method comprising:
          forming a first strontium oxide material on the ruthenium electrode by oxidizing a strontium precursor with water vapor;

forming a second strontium oxide material on the first strontium oxide material by oxidizing a strontium precursor with ozone; and annealing the ruthenium electrode, the first strontium oxide material and the second strontium oxide material to form the strontium ruthenium oxide interface.

16. The memory device of claim 15, wherein, in the method, forming a first strontium oxide material on the ruthenium electrode by oxidizing a strontium precursor with water vapor comprises performing an atomic layer deposition process with the strontium precursor as a first precursor and the water vapor as a second precursor.

17. The memory device of claim 15, wherein, in the method, forming a second strontium oxide material on the first strontium oxide material by oxidizing a strontium precursor with ozone comprises performing an atomic layer deposition process with the strontium precursor as a first precursor and the ozone as a second precursor.

18. The memory device of claim 15, wherein, in the method, forming a first strontium oxide material on the ruthenium electrode by oxidizing a strontium precursor with water vapor and forming a second strontium oxide material on the first strontium oxide material by oxidizing a strontium precursor with ozone comprises using the same strontium precursor to form both the first strontium oxide material and the second strontium oxide material.

19. The memory device of claim 15, wherein, in the method, forming a first strontium oxide material and forming a second strontium oxide material comprises forming at least approximately 20 Å of the first strontium oxide material and/or forming at least approximately 20 Å of the second strontium oxide material.

20. The memory device of claim 19, wherein, in the method, forming a second strontium oxide material comprises forming approximately 30-60 Å of the second strontium oxide material.

* * * * *